United States Patent
We et al.

(10) Patent No.: US 9,596,768 B2
(45) Date of Patent: Mar. 14, 2017

(54) SUBSTRATE WITH CONDUCTIVE VIAS

(71) Applicant: QUALCOMM Incorporated, San Diego, CA (US)

(72) Inventors: Hong Bok We, San Diego, CA (US); Dong Wook Kim, San Diego, CA (US); Jae Sik Lee, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 23 days.

(21) Appl. No.: 14/196,481

(22) Filed: Mar. 4, 2014

(65) Prior Publication Data

US 2015/0257282 A1 Sep. 10, 2015

(51) Int. Cl.
| | | |
|---|---|---|
| *H05K 3/42* | (2006.01) | |
| *H05K 1/03* | (2006.01) | |
| *H05K 1/11* | (2006.01) | |
| *H05K 3/00* | (2006.01) | |
| *H01L 21/768* | (2006.01) | |
| *H01L 23/48* | (2006.01) | |
| *H01L 23/498* | (2006.01) | |
| *H01L 21/48* | (2006.01) | |

(52) U.S. Cl.
CPC .......... *H05K 3/426* (2013.01); *H01L 21/486* (2013.01); *H01L 21/76898* (2013.01); *H01L 23/481* (2013.01); *H01L 23/49827* (2013.01); *H05K 1/0306* (2013.01); *H05K 1/0313* (2013.01); *H05K 1/111* (2013.01); *H05K 1/115* (2013.01); *H05K 3/0094* (2013.01); *H01L 2224/18* (2013.01)

(58) Field of Classification Search
CPC ......... H01L 21/76804; H01L 21/76805; H01L 21/76808
See application file for complete search history.

(56) References Cited

U.S. PATENT DOCUMENTS

| | | |
|---|---|---|
| 7,495,316 B2 | 2/2009 | Kirby et al. |
| 8,115,292 B2 | 2/2012 | Toh et al. |
| 8,148,263 B2 | 4/2012 | Sinha |
| 8,324,101 B2 | 12/2012 | Akram et al. |

(Continued)

FOREIGN PATENT DOCUMENTS

| | | |
|---|---|---|
| EP | 1465246 A2 | 10/2004 |
| EP | 1775761 A1 | 4/2007 |

(Continued)

OTHER PUBLICATIONS

International Search Report and Written Opinion—PCT/US2015/017802—ISA/EPO—Jul. 7, 2015.

*Primary Examiner* — Mohammad Choudhry
(74) *Attorney, Agent, or Firm* — Muncy, Geissler, Olds & Lowe, P.C.

(57) ABSTRACT

A substrate includes a plurality of vias that are lined with dielectric polymer having a substantially uniform thickness. This substantial uniform thickness provides a lumen within each dielectric-polymer-layer-lined via that is substantially centered within the via. Subsequent deposition of metal into the lumen for each dielectric-polymer-layer-lined via thus provides conductive vias having substantially centered metal conductors.

23 Claims, 8 Drawing Sheets

(56) References Cited

U.S. PATENT DOCUMENTS

| | | | |
|---|---|---|---|
| 2003/0038344 A1* | 2/2003 | Palmer | H01L 21/76898 257/621 |
| 2008/0122031 A1 | 5/2008 | DeNatale et al. | |
| 2012/0193811 A1 | 8/2012 | Yang et al. | |
| 2013/0026645 A1 | 1/2013 | Mohammed et al. | |
| 2013/0264720 A1 | 10/2013 | Chun et al. | |

FOREIGN PATENT DOCUMENTS

| | | |
|---|---|---|
| JP | 2005026405 A | 1/2005 |
| JP | 2005332936 A | 12/2005 |

\* cited by examiner

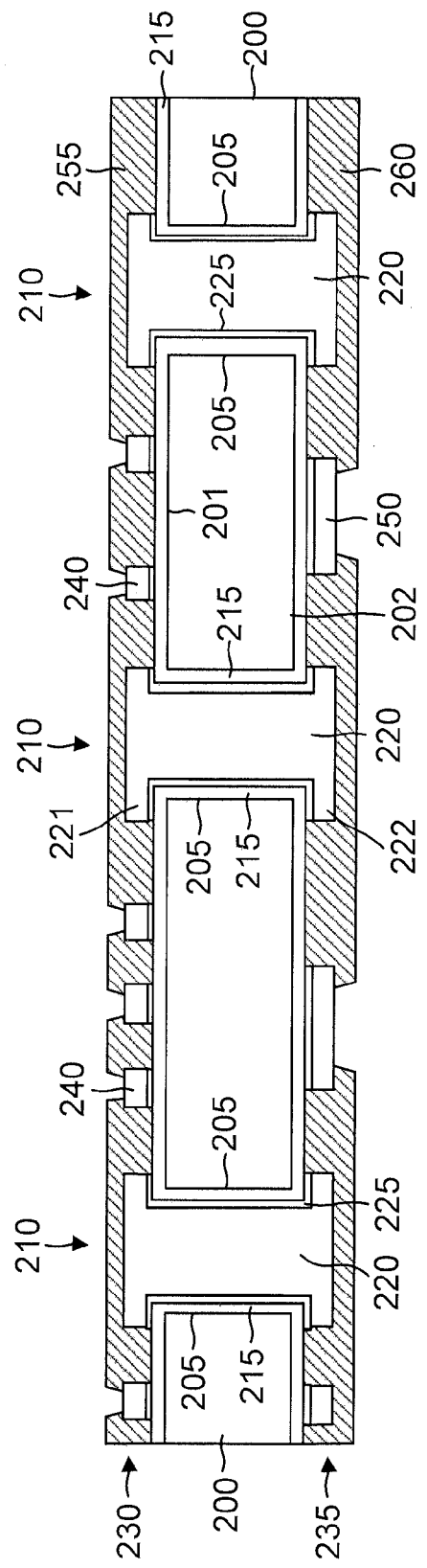

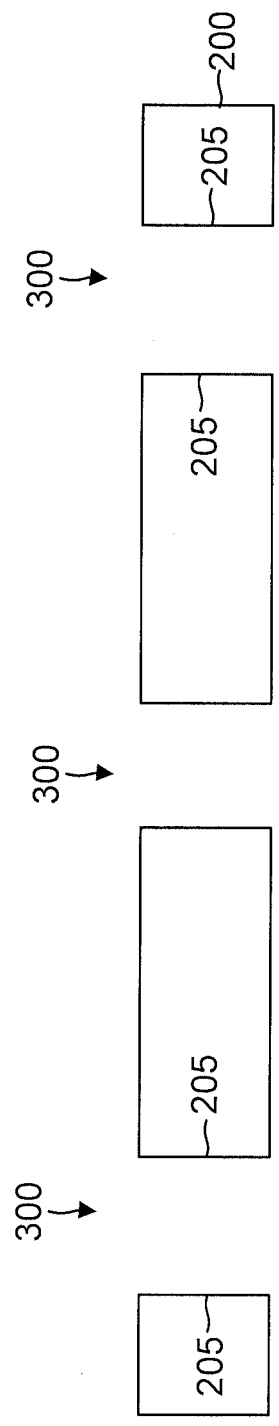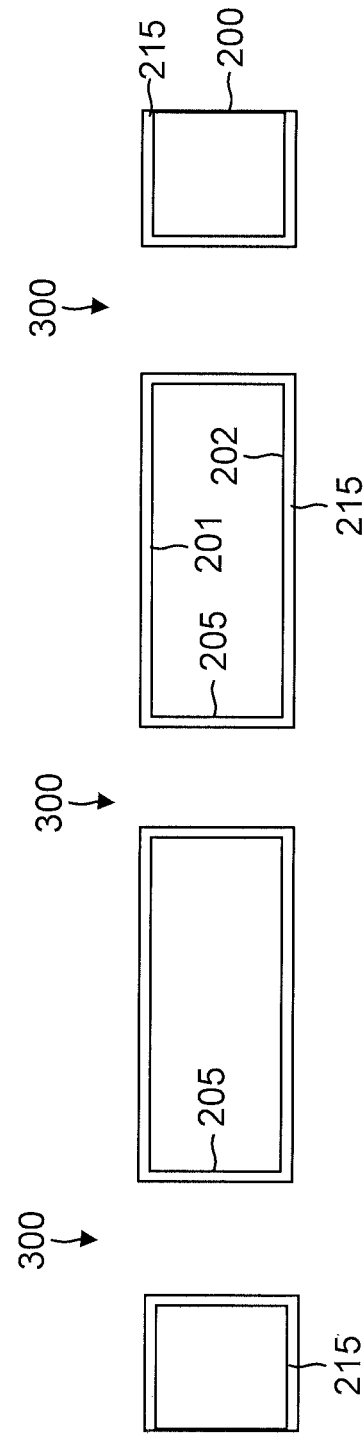
FIG. 3A
FIG. 3B

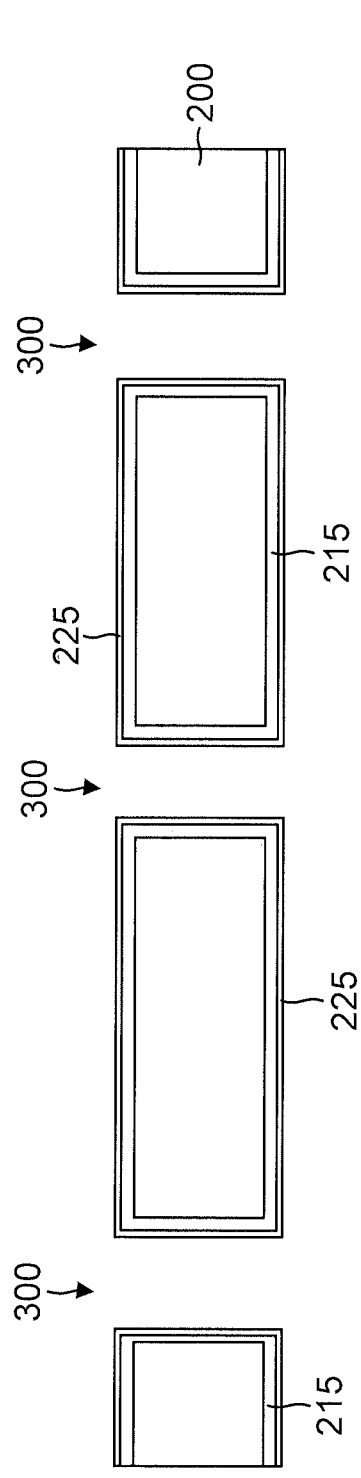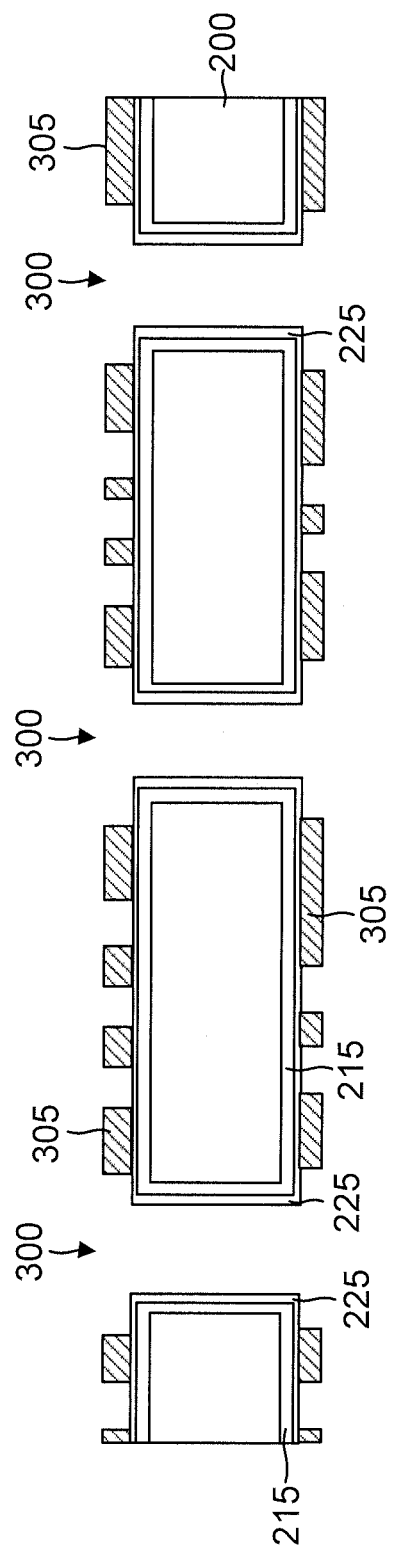
FIG. 3C
FIG. 3D

SUBSTRATE WITH CONDUCTIVE VIAS

TECHNICAL FIELD

This application relates to substrates, and more particularly to substrates with conductive vias.

BACKGROUND

The formation of conductive vias in substrates such as glass suffers from a number of issues. Typically, the raw glass substrate is perforated through laser drilling or etching to form the desired vias. A dielectric lamination process then fills the vias in the etched or drilled raw glass substrate and coats the upper and lower surfaces of the substrate with laminated dielectric. The manufacturer must then employ a second drilling or etching process to reopen the dielectric-filled vias to form dielectric-lined vias. Plating the dielectric-lined vias with metal finishes the desired conductive vias. Because of the second drilling process, the formation of such conductive vias may be designated as a via-in-via process.

This second drilling process is problematic in that as the substrates are made ever thinner, it is desirable to also reduce the via diameters. But there is a considerable tolerance in the registration process used to align the substrate during the second drilling step such that the drilling may not be centered in each dielectric-filled via. For example, the alignment marks used on a glass substrate during the registration process are difficult to image due to the transparency of the glass. The off-centered drilling leaves a reopened via with a dielectric lining that is not uniform in thickness, which is undesirable when the reopened via is filled with metal because the metal won't be centered in the via. For example, FIG. 1A shows a conventional circular via 100, which was initially filed with laminated dielectric 105 and then re-drilled. Because of the tolerance in the registration process for aligning the second drilling, metal 110 deposited into the drilled dielectric 105 is off center with regard to a via center as defined by the substrate via wall 115. This is quite problematic as the tolerance could be such as to have no dielectric lining left along point A along substrate wall 115. This lack of dielectric lining leads to voids and metal deposition problems. As a result, there is a conventional limit to the aspect ratio (the ratio of the substrate thickness to the via diameter) that can be achieved by the via-in-via process. That limit in turn inhibits density because interconnect pitch cannot be reduced as the via-in-via process requires a relatively low aspect ratio such as 2:1. For example, the via diameter may need to be at least 100 microns if the substrate thickness is 200 microns. The resulting relatively-wide conductive vias thus inhibit density. In addition, the lamination of the dielectric onto the raw drilled substrate is problematic due to the physical force required during the lamination. This is especially problematic when glass substrates are laminated due to their fragility.

Accordingly, there is a need in the art for conductive vias that do not require the via-in-via process for their formation.

SUMMARY

To provide a substrate having conductive vias without the disadvantages of the via-in-via process, the substrate vias are lined with a dielectric polymer layer using a chemical vapor deposition (CVD) process. Because of the CVD process, the dielectric polymer layer has a substantially uniform thickness across the substrate, including within the vias. The dielectric polymer layer has a thickness such that each via retains an open lumen despite the dielectric polymer layer lining the vias. In other words, the dielectric polymer is deposited so as to not fill the vias but instead to form a dielectric polymer layer lining each via so as to leave an open lumen. The uniform thickness of the dielectric polymer layer extends around the circumference of each open lumen such that each open lumen is thus substantially centered within the via.

Metal may then be deposited into the open lumens in the vias to form a metal conductor within each via extending from a first surface of the substrate to an opposing second surface. Because of the substantially uniform thickness of the dielectric polymer layer, each metal conductor is substantially centered within each via. This is quite advantageous as the aspect ratio for the vias may be increased as compared to conventional via-in-via-produced vias. Moreover, the deposition of the dielectric polymer layer protects the substrate during subsequent processing steps. In contrast, the dielectric lamination process used in the conventional via-in-via process increases the change of substrate damage due to the physical force needed during the lamination of dielectric. These and other advantages may be better appreciated with regard to the following detailed description.

BRIEF DESCRIPTION OF THE DRAWINGS

FIG. 2A is a cross-sectional view of a substrate including two metal layers and conductive vias formed without using a via-in-via process in accordance with an embodiment of the disclosure.

FIG. 3A is a cross-sectional view of the drilled raw glass substrate used to form the substrate of FIG. 2A.

FIG. 3B is a cross-sectional view of the substrate of FIG. 3A after the vias are lined with a dielectric polymer.

FIG. 3C is a cross-sectional view of the substrate of FIG. 3B after deposition of a metallic seed layer.

FIG. 3D is a cross-sectional view of the substrate of FIG. 3C after deposition and patterning of a photoresist layer.

DESCRIPTION

A substrate with vias is provided that does not require a via-in-via process. To provide a better understanding of the advantageous properties of the disclosed substrate, some terminology will first be discussed. As used herein, the term "via" without further limitation refers to a through hole in the substrate. For example, a raw substrate having a first surface and an opposing second surface may be laser drilled from the first surface through to the second surface to form vias. In contrast, the term "conductive via" refers to a metal-conductor-containing via. The vias are lined with a dielectric polymer using a chemical vapor deposition process to form dielectric-polymer-lined vias. Metal may then be deposited into the dielectric-polymer-lined vias to complete the conductive vias.

Figure 1A:
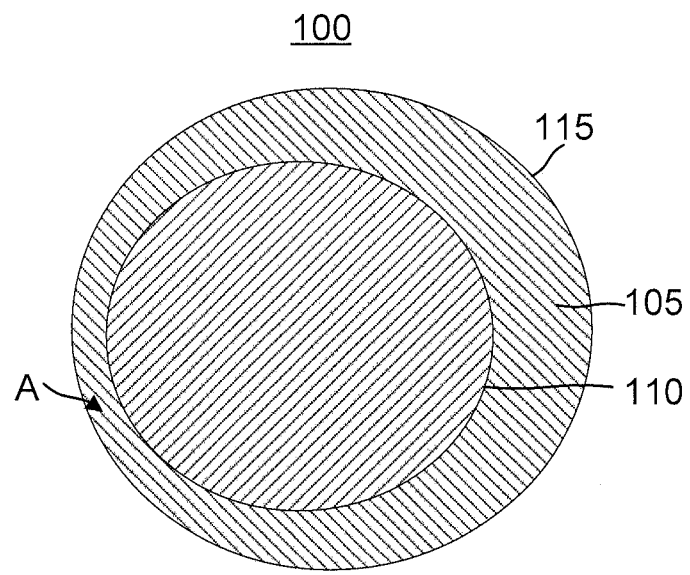
FIG. 1A is a cross-sectional view of a conductive via formed using a conventional via-in-via process.
Figure 1B:
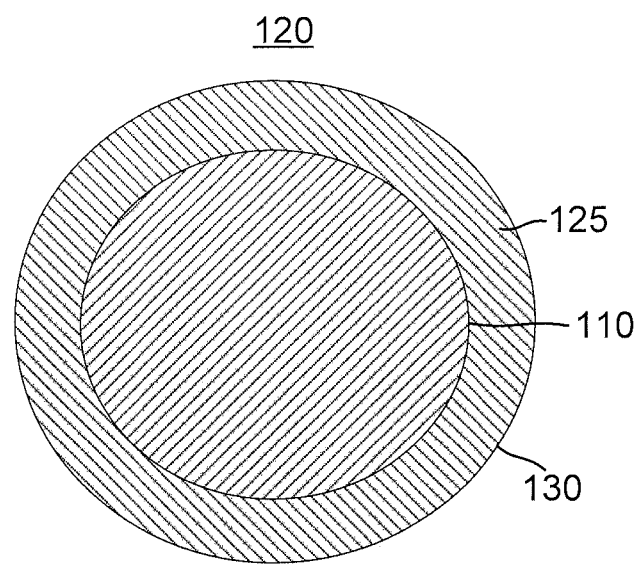
FIG. 1B is a cross-sectional view of a conductive via formed in accordance with an embodiment of the disclosure.

The lining of the vias with a dielectric polymer layer is quite advantageous as the chemical vapor deposition process ensures a substantially uniform thickness to the dielectric polymer lining. The deposition of dielectric polymer is timed so that the vias are not completely filled with dielectric polymer but instead are lined with the dielectric polymer layer so as to retain a sufficiently-large open lumen diameter that can then receive a subsequent deposition of metal. The resulting deposition of metal into the lumen of each dielectric-polymer-lined via is thus centered with regard to the via walls in the substrate. For example, a circular via 120 may be formed in a substrate as shown in the cross-sectional view of FIG. 1B. If a dielectric polymer layer 125 is deposited using a chemical vapor deposition process, it will have a substantially uniform thickness with regard to the circumference of a substrate via wall 130. A subsequent deposition of metal 110 is thus centered within conductive via 120. In contrast, the via-in-via process suffers from the likelihood of off-centered metal within the conductive via. Given this advantageous centering of metal within the conductive via, the aspect ratio may be greatly enhanced. For example, the aspect ratio for the conductive vias disclosed herein may be as great as 10:1 or even 30:1 or greater. In contrast, the conventional via-in-via process was typically limited to much lower aspect ratios such as 2:1. The disclosed conductive vias thus may have a relatively small diameter, which promotes a reduced interconnect pitch and thus enhances density. In addition, the deposition of the dielectric polymer layer involves no physical force on the substrate and protects the substrate from damage in subsequent manufacturing steps. In contrast, the dielectric lamination process for the via-in-via process involves the danger of substrate breakage, particularly in the case of fragile substrates such as glass. These and other advantages may be better appreciated through the following discussion of some example embodiments.

Example Embodiments

Substrates for supporting the disclosed conductive vias may be generally planar and thus have a first planar surface and an opposing second planar surface. The conductive vias extend between the first and second planar surfaces. It will be appreciated, however, that non-planar substrate surfaces are also within the scope of the disclosure. Each substrate surface may support one or more metal layers that may be patterned into interconnects, pads, and other conductive structures. If each substrate surface supports just one metal layer, the substrate may be denoted as a two-metal-layer substrate. Should each substrate surface support two metal layers, the substrate may be denoted as a four-metal-layer substrate. The number of metal layers for the substrates disclosed herein is a design choice. A two-metal-layer embodiment will be discussed first followed by a discussion of a four-metal-layer embodiment.

A two-metal layer substrate 200 with conductive vias 210 is shown in cross-section in FIG. 2A. The following discussion discloses a glass substrate 200 but it will be appreciated that conductive vias 210 may be readily formed in other types of substrates such as organic polymer substrates and semiconductor substrates. Each conductive via 210 includes a centered metal conductor 220 extending from a first surface 201 of substrate 200 to an opposing second surface 202 of substrate 200. The deposition of metal conductors 220 to complete each conductive via 210 also forms a first metal layer 230 adjacent to substrate first surface 201 and a second metal layer 235 adjacent to substrate second surface 202. For example, first metal layer 230 may be patterned to form pads 240. In addition, first metal layer 230 may be patterned to form interconnections (not illustrated) between pads 240 and corresponding ones of metal conductors 220. Similarly, second metal layer 235 may be patterned to form pads 250 and interconnections (not illustrated).

To facilitate the interconnection of appropriate ones of pads 240 and 250 to corresponding metal conductors 220, metal conductors 220 may be deposited so as to have an I-shaped cross-section that forms lateral extensions 221 in metal layer 230 as well as lateral extensions 222 in metal layer 235. Regardless of their cross-sectional shape, each metal conductor 220 is substantially centered within each conductive via 210. In particular, this centering is effected by a dielectric polymer layer 215 having a substantially uniform thickness that covers substrate surfaces 201 and 202 as well as substrate via walls 205 for each conductive via 210. Because dielectric polymer layer 215 is deposited using, for example, a chemical vapor deposition process, it has a relatively uniform thickness. The thickness of dielectric polymer layer 215 depends upon the deposition time—the more time for the deposition process, the greater the thickness. For example, some embodiments may have a thickness for dielectric polymer layer 215 of five microns whereas other embodiments may have a greater thickness such as twenty microns. Other embodiments may have thicknesses outside of such a range depending upon the deposition time used to form dielectric polymer layer 215. The deposition of dielectric polymer layer 215 is controlled, however, as to leave an open lumen for each via 210 that is subsequently filled by a corresponding metal conductor 220.

Dielectric polymer layer 215 may comprise parylene (poly(p-xylylene)), polynapthalene, Teflon, polyimide, or other suitable dielectric polymers that may be formed from a suitable dielectric monomer using chemical vapor deposition (CVD). Regardless of the specific dielectric polymer used in various embodiments, the CVD process ensures a relatively uniform thickness to dielectric polymer layer 215. As a result, metal conductors 220 will be substantially centered within substrate via walls 205 for each conductive via 210. The deposition of metal conductors 220 as well as metal layers 230 and 235 may be performed using electrodeposition techniques (plating) such as through a semi-additive process. Alternatively, electroless deposition may be used. Electroplating may require a seed layer 225 to first be deposited over dielectric polymer layer 215 prior to the deposition of metal conductors 220. In contrast, an electroless deposition process does require not a seed layer. Metal conductors 220 and metal layers 230 and 235 may comprise any suitable metal such as copper or nickel. Similarly, seed layer 225 may comprise gold, silver, tungsten, or other metals such as copper or nickel. After the deposition of metal to form metal conductors 220 as well as metal layers 230 and 235, a dielectric or passivation layer 255 may be deposited adjacent surface 201 of substrate 200. Dielectric layer 255 is patterned to expose pads 240. A similar dielectric or passivation layer 260 may be deposited adjacent surface 202 of substrate 200 and patterned to expose pads 250. A die (or multiple dies) may then be coupled to pads 240 whereas pads 250 may be coupled to a circuit board to complete an integrated circuit package. Alternatively, substrate 200 may be used to support passive components or another package substrate such as in a package-on-package construction. Note that dielectric/passivation layers 255 and 260 may also be patterned to expose metal conductors 220 analogously to pads 240 and 250.

Figure 2B:
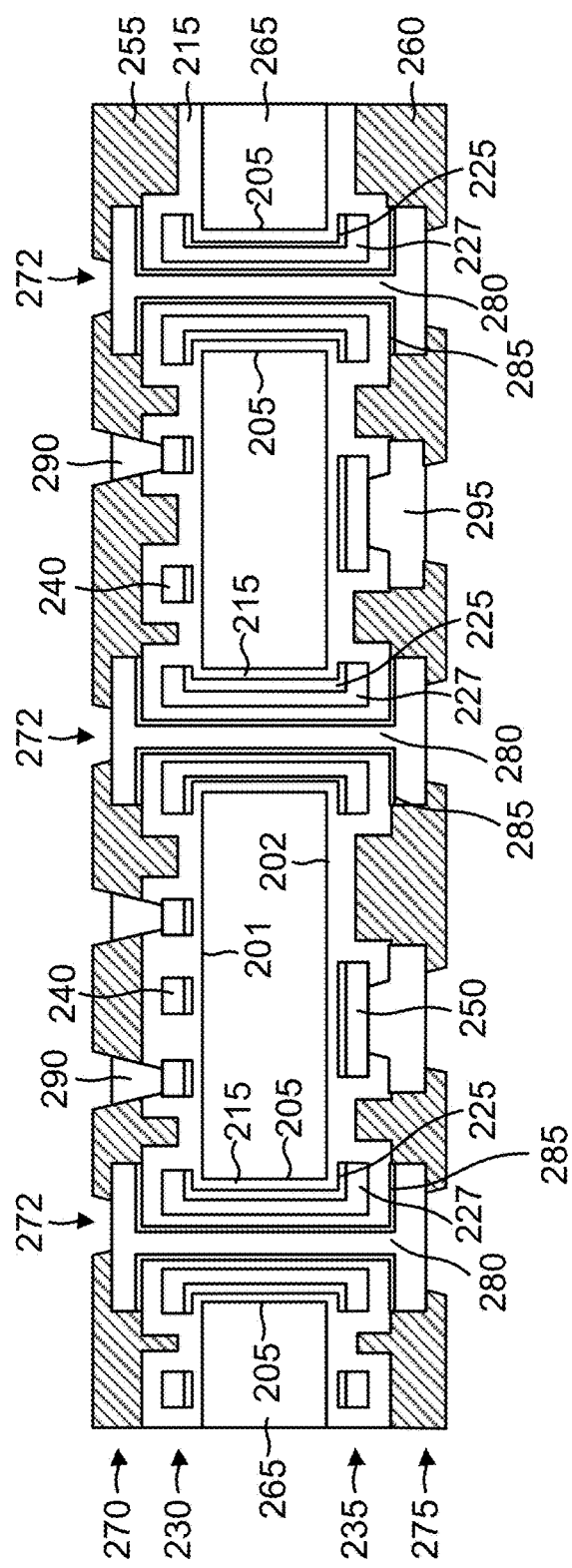
FIG. 2B is a cross-sectional view of a substrate including four metal layers and conductive vias formed without using a via-in-via process in accordance with an embodiment of the disclosure.

A four-metal-layer substrate 265 is shown in cross-section in FIG. 2B that includes a plurality of conductive vias 272. Metal layers 230 and 235 are formed as discussed with regard to FIG. 2A with regard to dielectric polymer layer 215 covering surfaces 201 and 202 of substrate 265. Similarly, seed layer 225 is deposited as discussed with regard to FIG. 2A. After formation of seed layer 225, metal is deposited such as through electrodeposition or an electroless process to only partially fill within via walls 205 to form hollow metal conductors 227 on dielectric polymer layer 215. In contrast, such a deposition step produced solid metal conductors 220 in substrate 200 of FIG. 2A. Each hollow metal conductor 227 has an open lumen extending from surface 201 to surface 202 of substrate 265. Additional dielectric polymer layer 215 may then be deposited within the lumens of hollow metal conductors 227 prior to deposition of metal conductors 280. Metal conductors 280 are analogous to metal conductors 220 of FIG. 2A in that metal conductors 280 completely fill the remaining via lumen and extend from substrate surface 201 to substrate surface 202. The same metal deposition that forms metal conductors 280 also forms additional metal layers 270 and 275. Metal layer 270 is adjacent metal layer 230 whereas metal layer 275 is adjacent metal layer 235. Should an electrodeposition process be used to form metal layers 270 and 275 as well as metal conductors 280, an additional seed layer 285 may be deposited over the additional dielectric polymer layer 215 prior to the formation of metal conductors 280. The additional metal layers 270 and 275 are patterned to form the desired pads and interconnections as discussed analogously with regard to FIG. 2A. For example, metal layer 270 may be patterned to form pads 290 that couple through vias to interconnects 240 within metal layer 230. Similarly, metal layer 275 may be patterned to form pads 295 that couple through vias to interconnects 250 within metal layer 235. It will readily be appreciated that additional metal layers may be formed in an analogous fashion. After the deposition of metal layers 270 and 275 as well as metal conductors 280, dielectric or passivation layers 255 and 260 may be deposited as discussed analogously with regard to substrate 200 of FIG. 2A.

Regardless of how many metal layers are formed, the resulting conductive vias may be deemed to comprise a means for conducting electronic signals. For example, such a means in a two-metal-layer embodiment comprises metal conductor 220 whereas the means may comprise hollow metal conductors 227 and metal conductors 280 in a four-metal-layer embodiment. Some example methods of manufacture will now be discussed.

Example Method of Manufacture

A two-metal-layer substrate manufacture process may begin as shown in FIG. 3A. A substrate 200 such as a raw glass substrate, an organic polymer substrate, or a semiconductor substrate is perforated to form vias 300 having substrate via walls 205. For example, substrate 200 may be laser drilled or mechanically drilled to form vias 300. Alternatively, vias 300 may be etched through substrate 200.

After formation of vias 300, dielectric polymer layer 215 may be deposited through a chemical vapor deposition process to cover surfaces 201 and 202 of substrate 200 in addition to lining substrate via walls 205 as shown in FIG. 3B. Dielectric polymer layer 215 may comprise parylene (poly(p-xylylene)), polynapthalene, Teflon, polyimide, or other suitable dielectric polymers that may be formed from a suitable dielectric monomer using chemical vapor deposition (CVD). For example, in a parylene chemical vapor deposition process, a solid dimer is heated in a pyrolysis stage so that it forms a monomer gas. The vacuum chamber with the drilled substrate 200 receives the monomer gas that then polymerizes onto the drilled substrate 200 to form a parylene layer as dielectric polymer layer 215. The length of time that the drilled substrate is subjected to the monomer gas determines the thickness of the resulting dielectric polymer layer 215. In some embodiments, a thickness of five to twenty microns is suitable although it will be appreciated that thinner or thicker dielectric polymer layers 215 may be used in alternative embodiments. The thickness also depends upon the via diameter. For example, if the via diameter were 30 microns, one would plainly not use a dielectric polymer layer 215 thickness of fifteen microns as the resulting vias would then be completely filled with dielectric polymer. There would then be no via into which metal conductors 220 could be plated. On the other hand, if the via diameter were 100 microns, a dielectric polymer layer 215 thickness of fifteen microns may be suitable in that the resulting dielectric-polymer-layer-lined vias would still have an open lumen of seventy microns in diameter to receive metal conductors 220. The deposition of dielectric polymer layer 215 is advantageous because it enables centered conductors in vias 300 as discussed with regard to FIG. 1B. In addition, dielectric polymer layer 215 protects fragile substrate materials such as glass from breakage during subsequent processing steps.

A seed layer 225 may then be deposited over dielectric polymer layer 215 as shown in FIG. 3C. For example, seed layer 225 such as copper, nickel, tungsten, silver, or gold may be sputtered or otherwise deposited onto dielectric polymer layer 215. Seed layer 225 may be relatively thin such as just a few microns in thickness or less. It will be appreciated that seed layer 225 may be omitted if an electroplating process is not used subsequently such as in electroless embodiments. After formation of seed layer 225, a mask layer 305 may be deposited over seed layer 225 on surfaces 201 and 202 of substrate 200 and patterned as shown in FIG. 3D. For example, mask layer 305 may be patterned using photolithographic techniques. After patterning, mask layer 305 masks off those areas on substrate 200 that will not receive metal in the subsequent formation of the metal layers.

Figure 3E:
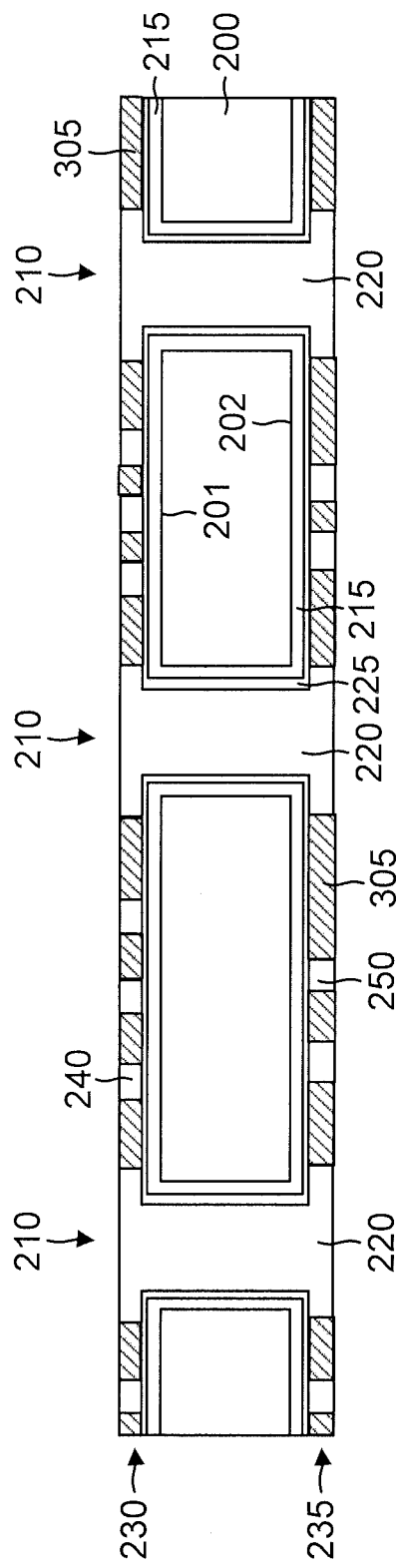
FIG. 3E is a cross-sectional view of the substrate of FIG. 3D after deposition of a metal to form the two metal layers and the conductive vias.
Figure 3F:
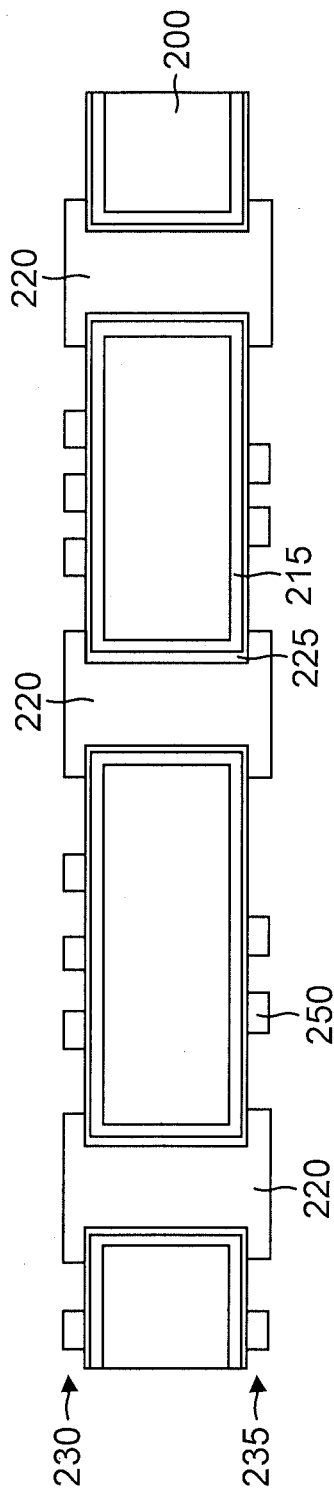
FIG. 3F is a cross-sectional view of the substrate of FIG. 3E after stripping of the patterned photoresist layer.

With patterned mask 305 in place, metal may be deposited such as through a plating process to form metal layers 230 and 235 as well as metal conductors 220 as shown in FIG. 3E. Alternatively, an electroless deposition process may be used to deposit metal layers 230 and 235 as well as metal conductors 220. Metal layers 230 and 235 as well as metal conductors 220 may comprise copper, nickel, or others suitable metals. Deposition of metal conductors 220 completes the formation of conductive vias 210. The same deposition of metal also deposits metal layer 230 through the openings in patterned mask 305 adjacent surface 201 of substrate 200 to form the desired pads 240 and also interconnects (not illustrated) to metal conductors 220. Similarly, this deposition of metal also deposits metal layer 235 to form the desired pads 250 and corresponding interconnects (not illustrated). The patterned mask 305 may then be stripped or removed as shown in FIG. 3F. The exposed areas of seed layer 225 (those portions not covered by pads 240 and 250) may then be flash etched away followed by deposition of dielectric/passivation layers 255 and 260 (shown in FIG. 2A) to complete the substrate-with-conductive-vias manufacture.

The manufacture of additional metal layers such as layers 270 and 275 of FIG. 2B is analogous. For example, after formation of metal layers 230 and 235 as shown in FIG. 2E, additional dielectric polymer 215 as shown in FIG. 2B is deposited to cover metal layers 230 and 235 as well as to line hollow metal conductors 227. After deposition of additional seed layer 285, a second patterned mask layer (not illustrated) may be deposited so that pads 290 and 295 are formed along with the deposition of metal conductors 280. The second patterned mask layer is then etched away, followed by the flash etching of seed layer 285 (in an embodiment that include a seed layer). Deposition of dielectric/passivation layers 255 and 260 would complete the four-metal-layer construction. It will be appreciated that additional metal layers may be added in an analogous fashion.

Figure 4:
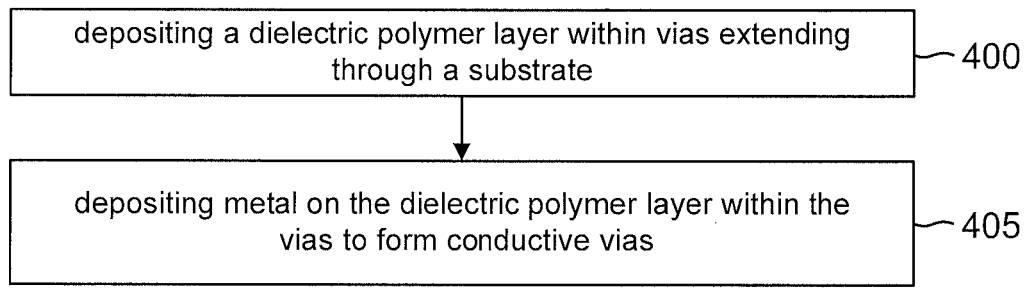
FIG. 4 is a flowchart of an example method of manufacturing for a conductive-via-containing substrate with requiring a via-in-via process in accordance with an embodiment of the disclosure.

The manufacture process may be summarized as shown in the flowchart of FIG. 4. An initial step 400 comprises depositing a dielectric polymer layer within vias extending through a substrate. A subsequent step 405 comprises depositing metal on the dielectric polymer layer to form conductive vias. Such a deposition may be performed using electroplating or electroless techniques. Some example electronic systems incorporating a substrate having the advantageous conductive vias disclosed herein will now be discussed.

Example Electronic Systems

Figure 5:
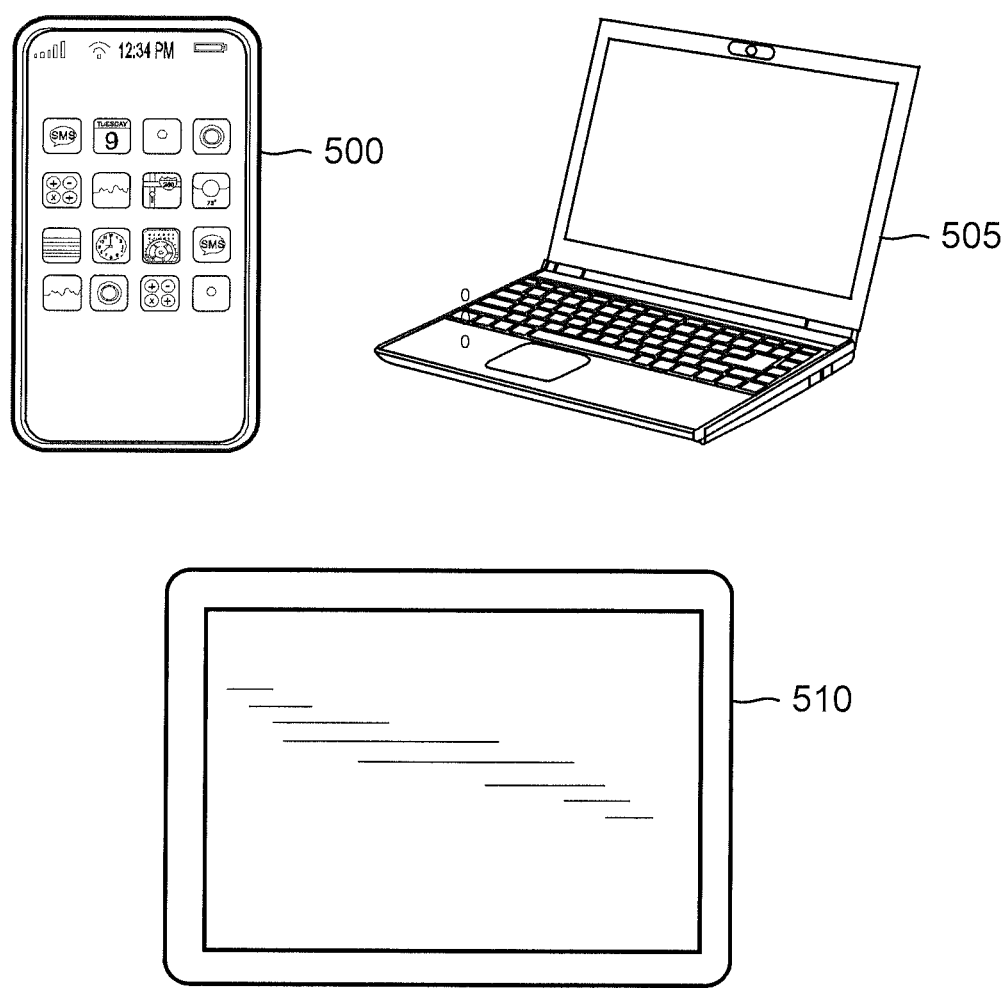
FIG. 5 illustrates some example electronic systems incorporating a conductive-via-containing package in accordance with an embodiment of the disclosure.

Integrated circuit packages including a substrate having conductive vias as disclosed herein may be incorporated into a wide variety of electronic systems. For example, as shown in FIG. 5, a cell phone 500, a laptop 505, and a tablet PC 510 may all include an integrated circuit package incorporating a substrate constructed in accordance with the disclosure. Other exemplary electronic systems such as a music player, a video player, a communication device, and a personal computer may also be configured with integrated circuit packages constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A device, comprising:
   a substrate having a first surface and a second surface opposite the first surface, the substrate including a plurality of vias extending from the first surface to the second surface;
   a dielectric polymer layer on the first and second surfaces of the substrate and lining the plurality of vias;
   a plurality of metal conductors corresponding to the plurality of vias, each metal conductor extending from the first surface to the second surface of the substrate through the corresponding via;
   a first plurality of pads adjacent the first surface and a second plurality of pads adjacent the second surface; and
   a seed layer on the dielectric polymer layer such that the seed layer is between each of the plurality of metal conductors and each portion of the dielectric polymer layer lining the via corresponding to that metal conductor, between each of the first plurality of pads and each portion of the dielectric polymer layer on the first surface corresponding to that first pad, and between each of the second plurality of pads and each portion of the dielectric polymer layer on the second surface corresponding to that second pad,
   wherein in between two adjacent vias, there is no seed layer on each of one or more portions of the dielectric polymer layer not covered by the plurality of metal conductors, not covered by the first plurality of pads, and not covered by the second plurality of pads.

2. The device of claim 1,
   wherein the seed layer surrounds a lumen within each via, and
   wherein each metal conductor fills the lumen in its corresponding via.

3. The device of claim 1,
   wherein the plurality of metal conductors comprises a plurality of hollow metal conductors, and
   wherein the dielectric polymer layer further lines the hollow metal conductors to form dielectric-polymer-layer-lined lumens within the hollow metal conductors,
   the device further comprising a plurality of second metal conductors corresponding to the plurality of vias, each second metal conductor fills the dielectric-polymer-layer lined lumens for the hollow metal conductor in the corresponding via.

4. The device of claim 1, wherein the dielectric polymer layer is selected from the group consisting of poly(p-xylylene)), polynapthalene, Teflon, and polyimide.

5. The device of claim 1, wherein the substrate is selected from the group consisting of glass, semiconductor, and organic polymer.

6. The device of claim 2, wherein each metal conductor has an I-shaped cross-section.

7. The device of claim 1, wherein the plurality of metal conductors comprise copper.

8. The device of claim 1, further comprising a first passivation layer adjacent the first surface and patterned to expose the first plurality of pads.

9. The device of claim 8, further comprising a second passivation layer adjacent the second surface and patterned to expose the second plurality of pads.

10. The device of claim 1, wherein the device is incorporated into at least one of a cellphone, a laptop, a tablet, a music player, a communication device, a computer, and a video player.

11. The device of claim 3, wherein the second metal conductors are configured to form a third plurality of pads.

12. A device, comprising:
   a substrate including a plurality of vias;
   a dielectric polymer layer on a surface of the substrate and lining the plurality of vias;
   means for conducting signals through the plurality of vias;
   a plurality of pads adjacent the surface of the substrate; and
   a seed layer on the dielectric polymer layer such that the seed layer is between the means for conducting signals and portions of the dielectric polymer layer lining the plurality of vias, and between each of the plurality of pads and each portion of the dielectric polymer layer on the surface corresponding to that pad, wherein in between two adjacent vias, there is no seed layer on each of one or more portions of the dielectric polymer layer not covered by the means for conducting signals and not covered by the plurality of pads.

13. The device of claim 12, wherein the means for conducting signals comprises metal configured to completely fill a lumen within each dielectric-polymer-layer-lined via.

14. The device of claim 12, wherein the means for conducting signals for each dielectric-polymer-layer-lined via comprises a hollow metal cylinder and a solid metal conductor extending through the hollow metal cylinder.

15. The device of claim 14, wherein an additional dielectric polymer layer insulates the hollow metal cylinders from the solid metal conductors.

16. The device of claim 12, wherein the substrate is selected from the group consisting of glass, semiconductor, and organic polymer.

17. The device of claim 12, further comprising a die coupled to the plurality of pads through a corresponding plurality of interconnects.

18. The device of claim 1, wherein the seed layer directly contacts the dielectric polymer layer, the plurality of metal conductors, the first plurality of pads, and the second plurality of pads.

19. The device of claim 12, wherein the seed layer directly contacts the dielectric polymer layer, the means for conducting signals, and the plurality of pads.

20. The device of claim 1, wherein the first surface of the substrate is substantially planar and/or the second surface of the substrate is substantially planar.

21. The device of claim 12, wherein the first surface of the substrate is substantially planar and/or the second surface of the substrate is substantially planar.

22. The device of claim 1, wherein thicknesses of portions of the dielectric polymer layer lining the plurality vias are substantially uniform.

23. The device of claim 12, wherein thicknesses of portions of the dielectric polymer layer lining the plurality vias are substantially uniform.

* * * * *